United States Patent [19]
Wong et al.

[11] Patent Number: 5,424,686
[45] Date of Patent: Jun. 13, 1995

[54] NEGATIVE-RESISTANCE-COMPENSATED MICROWAVE BUFFER

[75] Inventors: Stephen L. Wong, Scarsdale, N.Y.; Jose M. Garcia, North Bergen, N.J.

[73] Assignee: Philips Electronics North America Corporation, New York, N.Y.

[21] Appl. No.: 230,351

[22] Filed: Apr. 20, 1994

[51] Int. Cl.⁶ ..................... H03F 3/191; H03H 11/00
[52] U.S. Cl. ..................................... 330/302; 333/217
[58] Field of Search ............... 330/286, 302, 306, 310, 330/311; 333/213, 214, 216, 217

[56] References Cited

U.S. PATENT DOCUMENTS 3,693,105  9/1972  Kleinberg ................... 333/217 X
4,107,621  8/1978  Furutani et al. ............. 330/306 X

OTHER PUBLICATIONS

IBM Technical Disclosure Bulletin, vol. 32, No. 8A, Jan. 1990, "Optimized VLSI CMOS Bypass Capacitor", pp. 260–262.

Wakimoto et al., "A Low-Power Wide-Band Amplifier Using A New Parasitic Capacitance Compensation Technique", IEEE Journal of Solid-State Circuits, vol. 25, No. 1, Feb. 1990, pp. 200–206.

*Primary Examiner*—Steven Mottola
*Attorney, Agent, or Firm*—Robert J. Kraus

[57] ABSTRACT

A monolithic microwave buffer amplifier is adapted to increase its input impedance at microwave frequencies. Capacitive reactances in first and second stages of the buffer amplifier appear collectively at the input of the first stage as a negative resistance. Compensating positive resistance is electrically connected to the input of the first stage to cancel the negative resistance and provide a sufficiently high resistive input impedance.

19 Claims, 4 Drawing Sheets

NEGATIVE-RESISTANCE-COMPENSATED MICROWAVE BUFFER

BACKGROUND OF THE INVENTION

1. Field of the Invention

This invention relates to microwave buffer circuits, and in particular to monolithic microwave buffer amplifiers having high input impedances.

2. Description of Related Art

High-input-impedance microwave buffer amplifiers are particularly useful for coupling cascaded microwave circuits and/or components. When utilized in this manner, such a buffer amplifier couples an output of a first microwave circuit or a microwave component with an input of a second microwave circuit or component to prevent the input from loading down the output.

In monolithic microwave buffer amplifiers, and particularly in the case of field-effect transistor (FET) or bipolar transistor stages, the influence of the transistor input capacitance on the buffer amplifier input impedance becomes increasingly dominant over that of the transistor input resistance as the operating frequency is increased above the 3 dB rolloff frequency $f_{3dB}$. As used in this patent application, the term 3 dB rolloff frequency means that frequency at which the gain drops more than 3 dB below the nominal DC open-loop gain A of the amplifier. An example of this gain dropoff is illustrated in FIG. 1. Typically, the input impedance $Z_{IN}$ is equivalent to an input resistance $R_i$ electrically connected in parallel with an input capacitance $C_i$. As the operating frequency of the buffer amplifier is increased above $f_{3dB}$, the capacitive reactance $\frac{1}{2\pi fC_i}$ decreases relative to the parallel resistance $R_i$ resulting in a comparable decrease in the magnitude of the input impedance. An example of this decrease is also illustrated in FIG. 1. Note from the example that the magnitude of the input impedance $Z_{IN}$ of such a buffer amplifier at the microwave frequency of 1 GHz can be a very low value, such as 2 ohms. This can severely load the output of a circuit or a microwave component coupled to the input. This input characteristic of monolithic microwave buffer amplifiers typically limits their usefulness to situations where the microwave circuits and/or components are operated at frequencies below the 3 dB rolloff frequency of the buffer amplifiers.

SUMMARY OF THE INVENTION

It is an object of the invention to provide a monolithic microwave buffer amplifier having a positive input impedance which is sufficiently large, even at frequencies above the 3 dB rolloff frequency, to enable practical operation above that frequency.

It is another object of the invention to provide a monolithic microwave buffer amplifier having an input impedance in which the dominance of the capacitive component is at least substantially reduced with respect to the resistive component at frequencies above the 3 dB rolloff frequency.

In accordance with the invention, a monolithic microwave buffer amplifier includes cascaded first and second stages, each having an input impedance comprising a component which is capacitively reactive above the 3 dB rolloff frequency. During operation of the cascaded stages, the capacitively-reactive components cooperate to produce a 180° phase shift between the input current and the input voltage, such that these components appear collectively at the input of the first stage as a negative input resistance of value $R^-$. The buffer amplifier further includes at its input a positive resistance of magnitude at least equal to the magnitude of the negative input resistance, to effectively cancel the negative resistance and provide an effective positive input resistance of sufficient magnitude to prevent excessive loading of a circuit or component coupled to the input.

Thus, in a buffer amplifier in accordance with the invention the input impedance is increased by substantially decreasing the capacitively reactive component of the input impedance. Further, by choosing a value of positive resistance which substantially cancels the negative input resistance, the resistive component of the input impedance can actually be increased to a value higher than that which would exist in a conventional buffer amplifier.

In a preferred embodiment, the buffer amplifier includes a parallel input resistance of value R, where $1/R = 1/R_{eff} + 1/R^+$. The total input impedance of the buffer amplifier is substantially real and includes as the real part the input resistance $R_{IN}$, where $1/R_{IN} = 1/R + 1/R^+ + 1/R_{eff}$, and where $R^+$ is equal to and substantially cancels the negative input resistance of value $R^-$. Thus, the resistance $R_{eff}$ comprises the effective input impedance of the buffer amplifier.

DESCRIPTION OF THE PREFERRED EMBODIMENTS

Figure 2A:
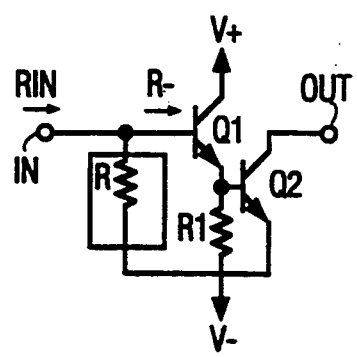
FIGS. 2A and 2B are schematic illustrations of monolithic microwave buffer amplifiers in accordance with first and second embodiments of the invention, respectively.

FIG. 2A illustrates a first embodiment of a buffer amplifier in accordance with the invention, which includes two cascaded bipolar-transistor stages. In the first stage, transistor $Q_1$ is electrically connected in an emitter-follower configuration with resistor $R_1$, which is electrically connected to the emitter. In the second stage, transistor $Q_2$ is electrically connected in a common-emitter configuration. The base of transistor $Q_1$ is electrically connected to an input IN of the buffer amplifier, and the collector of transistor $Q_2$ is electrically connected to an output OUT of the buffer amplifier. The buffer amplifier also includes terminals for connection to supply voltages $V^+$ and $V^-$, one of which is typically ground potential.

The combined first and second stages have an input capacitance which, at frequencies above $f_{3dB}$, is approximated by:

$$C_{IN} = \frac{C_1}{g_{m1}R_1} + \frac{C_2}{\beta_1} \quad (1)$$

where $g_{m1}$ is the transconductance of the first stage, $C_1$ and $C_2$ are the base-to-emitter capacitances of the transistors $Q_1$ and $Q_2$, respectively, and $\beta_1$ is the current-gain factor of transistor $Q_1$.

The input capacitance $C_{IN}$ is significantly smaller than the parallel combination of the capacitances $C_1$ and $C_2$, because $\beta_1$ and $g_{m1}R_1$ are each typically much greater than 1. Much of the capacitive influence on the buffer amplifier input impedance is converted to a negative input resistance which, at frequencies above the 3 dB rolloff frequency, is approximated by:

$$R^- = -\frac{g_{m1}}{(2\pi f)^2 C_1 C_2} \quad (2)$$

where f is the operating frequency.

Because the value of $R^-$ is negative, the buffer amplifier would be unstable, if not compensated. However, by electrically connecting in parallel with the input of the first stage a resistance R, having a value such that:

$$\frac{1}{R} = \frac{1}{R_{eff}} + \frac{1}{R^+} \quad (3)$$

where the magnitude of $R^+$ is made equal to the magnitude of $R^-$, the input resistance of the buffer amplifier will be converted to the real, positive resistance of value $R_{eff}$.

The total input resistance $R_{IN}$ is equivalent to a parallel combination of the three resistances $R^+$, $R^-$, and $R_{eff}$ where:

$$\frac{1}{R_{IN}} = \frac{1}{R_{eff}} + \frac{1}{R^+} + \frac{1}{R^-} \quad (4)$$

Because $R^+ = -R^-$, these two values cancel each other and the above equation reduces to:

$$R_{IN} = R_{eff} \quad (5)$$

As an example, if $R^-$ is equal to $-270$ ohms at a predetermined operating frequency (e.g. 1 GHz), and an effective input resistance $R_{IN} = R_{eff} = +230$ ohms is desired at this frequency, the value of the resistance $R^+$ would be equal to $+270$ ohms and the value of parallel resistance R would be equal to approximately $+125$ ohms, as determined from equation 3.

Figure 2B:
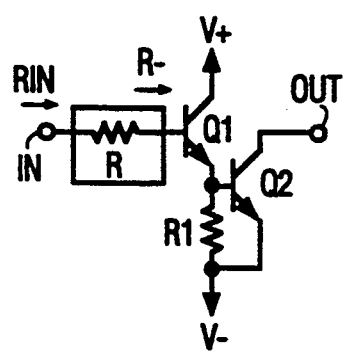

FIG. 2B illustrates a second embodiment of a buffer amplifier in accordance with the invention. This embodiment is similar to the first, but the resistance R is electrically connected in series with the input of the first stage. In this case:

$$R = R_{eff} + R^+ \quad (6)$$

and the value of series resistance R is made equal to $+500$ ohms. Note that, when R is placed in series rather than parallel, a larger value of R is needed to achieve the same positive input resistance $R_{IN}$.

Figure 1:
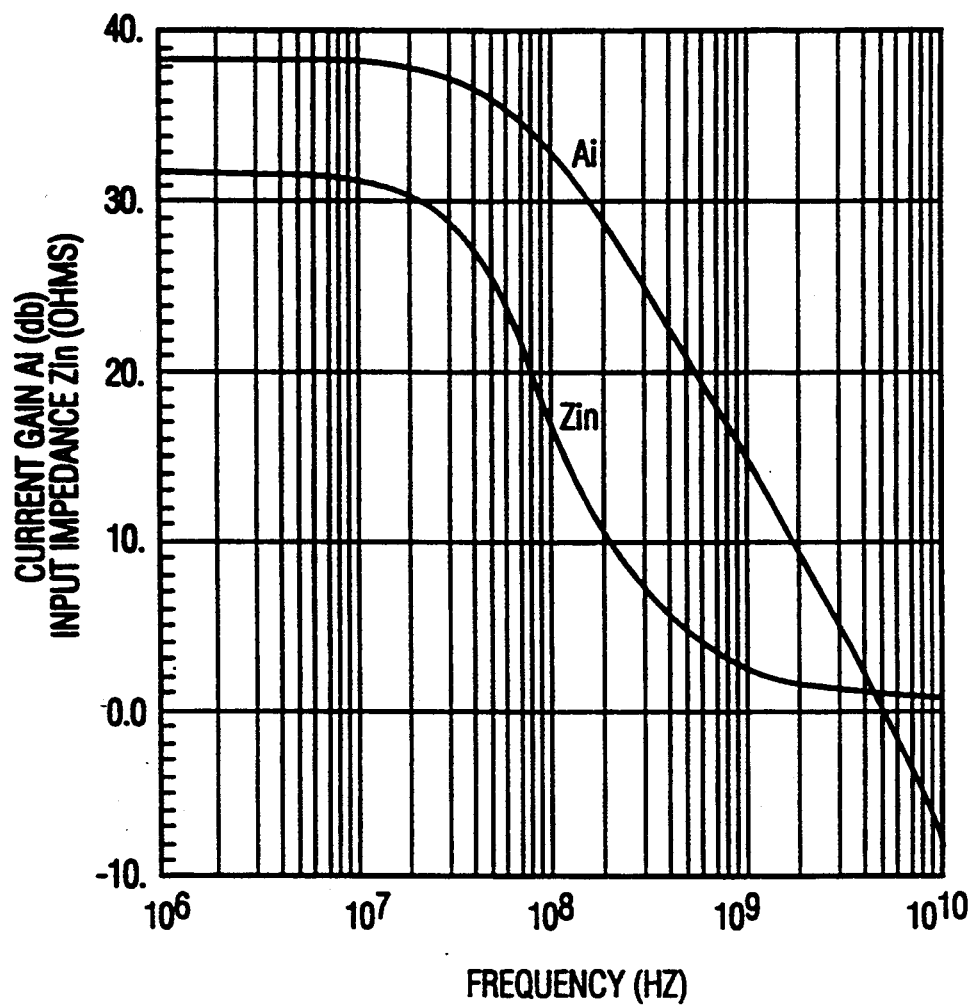
FIG. 1 is a representative graph illustrating the current gain vs. frequency characteristic, and the input impedance vs. frequency characteristic, of a typical monolithic microwave buffer amplifier.
Figure 3:
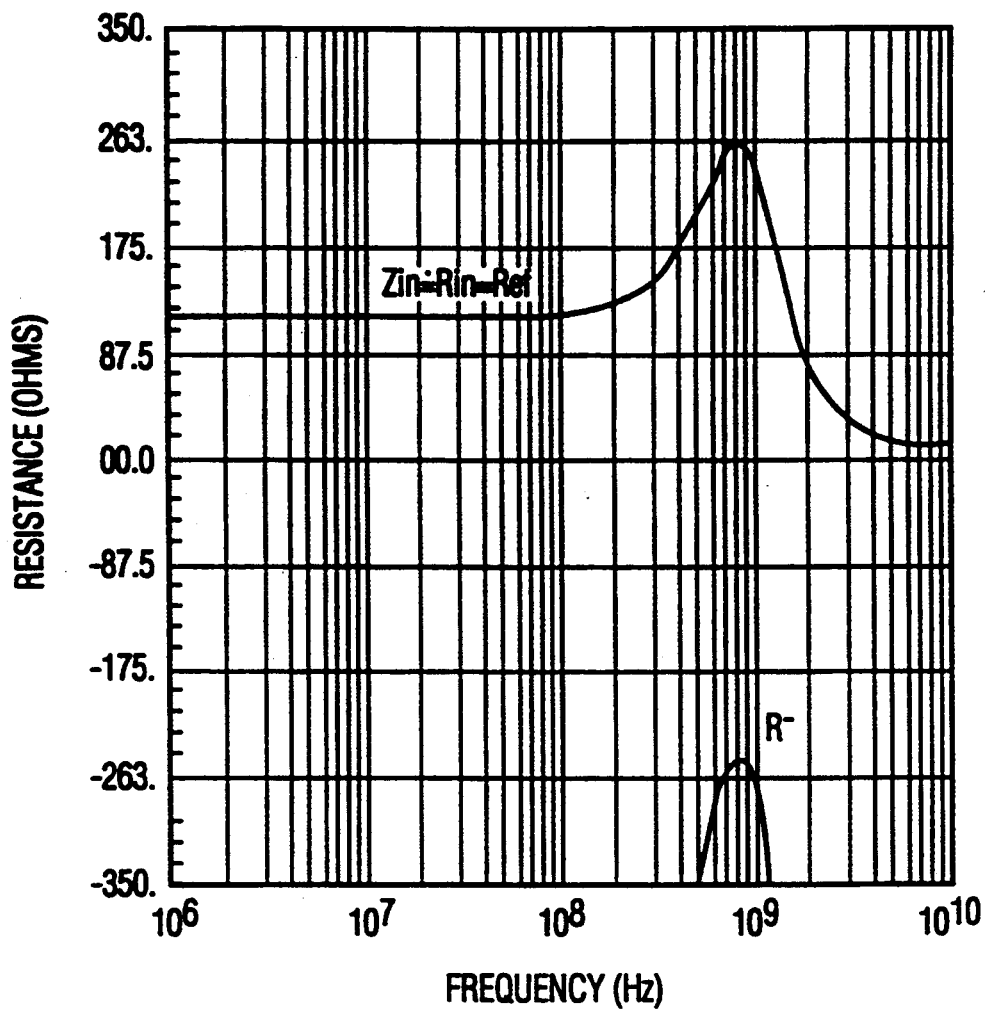
FIG. 3 is a representative graph illustrating the total input resistance vs. frequency characteristic, and the negative input resistance vs. frequency characteristic, of a monolithic microwave buffer amplifier in accordance with the invention.

FIG. 3 graphically illustrates, as a function of frequency, the negative input resistance $R^-$ and the effective input resistance $R_{IN} = R_{eff}$ of the buffer amplifier illustrated in FIG. 2A for the value of R calculated above. Note that, in comparison to FIG. 1, the effective input resistance $R_{IN}$ at $10^7$ Hz is approximately tripled. At frequencies above $10^8$ the effective input resistance remains positive and actually increases until it peaks near the designed 1 GHz operating frequency of the buffer amplifier, rather than dropping to the approximately 2 ohm magnitude at 1 GHz, as is illustrated in FIG. 1. For the FIG. 2B embodiment having the same value of R, the input resistance and negative input resistance curves would be similar, but not identical to those shown in FIG. 3.

Figure 4A:
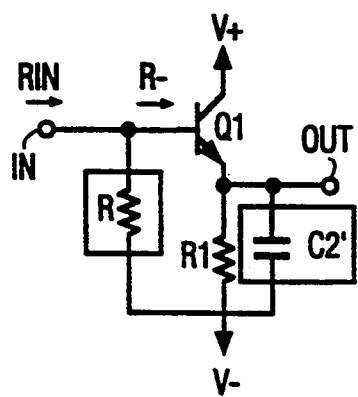
FIGS. 4A and 4B are schematic illustrations of monolithic microwave buffer amplifiers in accordance with third and fourth embodiments of the invention, respectively.

FIG. 4A illustrates a third embodiment of a buffer amplifier in accordance with the invention, which includes a first bipolar-transistor stage cascaded with a second capacitive stage. The first stage is substantially identical to the first stage of the first embodiment. The second stage, however, merely includes a capacitance of value $C'_2$ that is electrically connected to the output of the first stage and to the output OUT of the buffer amplifier.

Similarly to the first embodiment, the combined first and second stages of the third embodiment have a negative, input resistance which, at frequencies above the 3 dB rolloff frequency, is approximated by:

$$R^- = -\frac{g_{m1}}{(2\pi f)^2 C_1 C'_2} \quad (7)$$

and the input capacitance is approximated by:

$$C_{IN} = \frac{C_1}{g_{m1}R_1} + \frac{C'_2}{\beta_1} \quad (8)$$

where $g_{m1}$ is the transconductance of the first stage and $C_1$ is the base-to-emitter capacitance of the transistor $Q_1$. The value of the resistance R is determined by using equation 3, as for the first embodiment.

Figure 4B:
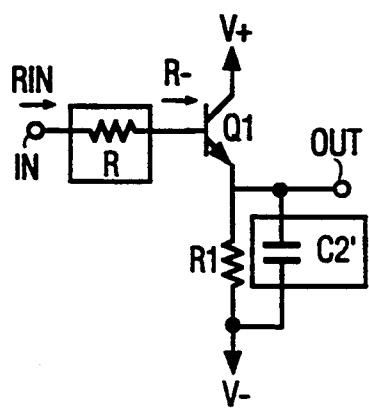

FIG. 4B illustrates a fourth embodiment of a buffer amplifier in accordance with the invention. This embodiment is similar to the third, but with the resistance R electrically connected in series with the input of the first stage, as in the second embodiment. Similarly, in this case equation 6 is utilized to determine the value of the resistance R.

Figure 5A:
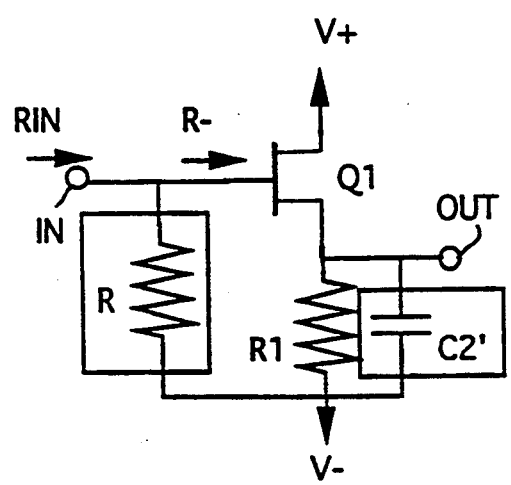
FIG. 5A is a schematic illustration of a monolithic microwave buffer amplifier in accordance with a fifth embodiment of the invention.

FIG. 5A illustrates a fifth embodiment of a buffer amplifier in accordance with the invention. This embodiment is similar to the third and fourth, but is an example of a buffer amplifier with a FET stage.

In any of the embodiments, the resistance R may be constructed by utilizing either passive or active components. For example, it may be constructed from one or more passive resistors or from one or more active components, such as diodes or transistors having forward-conducting resistive characteristics that vary with temperature and/or bias conditions similarly to the resistive characteristics of the first and/or second stages.

The capacitance $C'_2$ in the third and fourth embodiments may also be constructed from either passive or active components. As an example of an active-component construction, $C'_2$ could be the input capacitance of a subsequent stage.

Other alternative embodiments are also possible within the scope of the invention. For example, resistance $R_1$ may be constructed from one or more passive and/or active components. As an example of an active component, resistance $R_1$ could be a forward-biased diode or transistor junction. Additionally, components which do not have significant impedances at the operating frequencies of the buffer amplifier, such as a DC-blocking capacitor in series with resistance R, may be included in the buffer amplifier. As another alternative, the buffer amplifier may be coupled to the supply voltages via active and/or passive components.

We claim:

1. A monolithic microwave buffer amplifier for operating at frequencies above a predetermined 3 dB rolloff frequency, said buffer amplifier comprising cascaded first and second stages, each having an input impedance including a capacitively-reactive component, said capacitively-reactive components, during operation of the first and second stages, cooperating to produce a 180° phase shift such that said reactive components appear collectively at the input of the first stage as a negative input resistance, said buffer amplifier further including at its input a positive resistance having a magnitude which at least cancels said negative input resistance.

2. A monolithic microwave buffer amplifier as in claim 1 where the positive resistance is electrically connected in parallel with the input of the first stage.

3. A monolithic microwave buffer amplifier as in claim 1 where the positive resistance is electrically connected in series with the input of the first stage.

4. A monolithic microwave buffer amplifier as in claim 1 where the magnitude of the positive resistance is substantially greater than the magnitude of the negative input resistance.

5. A monolithic microwave buffer amplifier for operating at frequencies above a predetermined 3 dB rolloff frequency, said buffer amplifier comprising cascaded first and second stages, each having an input impedance including a capacitively-reactive component, said capacitively-reactive components, during operation of the first and second stages, cooperating to produce a 180° phase shift such that said reactive components appear collectively at the input of the first stage as a negative input resistance of value $R^-$, said buffer amplifier further including, electrically connected in parallel with the input of the first stage, an input resistance of value R, where $1/R = 1/R_{eff} + 1/R^+$, the total input resistance of the buffer amplifier being substantially equal to $R_{IN}$, where $1/R_{IN} = 1/R_{eff} + 1/R^+ + 1/R$, where $R^+$ is approximately equal to and substantially cancels the negative input resistance of value $R^-$, and where $R_{eff}$ comprises the effective input resistance of the buffer amplifier.

6. A monolithic microwave buffer amplifier for operating at frequencies above a predetermined 3 dB rolloff frequency, said buffer amplifier comprising cascaded first and second stages, each having an input impedance including a capacitively-reactive component, said capacitively-reactive components, during operation of the first and second stages, cooperating to produce a 180° phase shift such that said reactive components appear collectively at the input of the first stage as a negative input resistance of value $R^-$, said buffer amplifier further including, electrically connected in series with the input of the first stage, an input resistance of value R, where $R = R_{eff} + R^+$, the total input resistance of the buffer amplifier being substantially equal to $R_{IN}$, where $R_{IN} = R_{eff} + R^+ + R^-$, where $R^+$ is approximately equal to and substantially cancels the negative input resistance of value $R^-$, and where $R_{eff}$ comprises the effective input resistance of the buffer amplifier.

7. A monolithic microwave buffer amplifier for operating at frequencies above a predetermined 3 dB rolloff frequency, said buffer amplifier comprising:
 a. a first stage having an input impedance including a resistive component and a capacitively-reactive component;
 b. a second stage having an input impedance including a capacitively-reactive component, the input of said second stage being coupled to an output of the first stage;
 said capacitively-reactive components, during operation of the first and second stages, cooperating to produce a 180° phase shift such that said capacitively-reactive components appear collectively at the input of the first stage as a negative input resistance of value $R^-$;
 c. a resistance of value R electrically connected in parallel with the input of the first stage, where $1/R = 1/R_{eff} + 1/R^+$;
 the total input resistance of the buffer amplifier being substantially equal to $R_{IN}$, where $1R_{IN} = 1/R_{eff} + 1/R^+ + 1/R^-$, here $R^+$ is approximately equal to and substantially cancels the negative input resistance of value $R^-$, and where $R_{eff}$ comprises the effective input resistance of the buffer amplifier.

8. A monolithic microwave buffer amplifier for operating at frequencies above a predetermined 3 dB rolloff frequency, said buffer amplifier comprising:
 a. a first stage having an input impedance including a resistive component and a capacitively-reactive component;
 b. a second stage having an input impedance including a capacitively-reactive component, the input of said second stage being coupled to an output of the first stage;
 said capacitively-reactive components, during operation of the first and second stages, cooperating to produce a 180° phase shift such that said capacitively-reactive components appear collectively at the input of the first stage as a negative input resistance of value $R^-$;
 c. a resistance of value R electrically connected in series with the input of the first stage, where $R = R_{eff} + R^+$;
 the total input resistance of the buffer amplifier being substantially equal to $R_{IN}$, where $R_{IN} = R_{eff} + R^+ + R^-$, where $R^+$ is approximately equal to and substantially cancels the negative input resistance of value $R^-$, and where $R_{eff}$ comprises the effective input resistance of the buffer amplifier.

9. A monolithic microwave buffer amplifier as in claim 1, 5, 6, 7, or 8 where the first stage comprises an amplifier and the second stage comprises an impedance.

10. A monolithic microwave buffer amplifier as in claim 1, 5, 6, 7, or 8 where the first stage comprises a transistor.

11. A monolithic microwave buffer amplifier as in claim 10 where the transistor comprises a FET.

12. A monolithic microwave buffer amplifier as in claim 10 where the transistor comprises a bipolar transistor.

13. A monolithic microwave buffer amplifier as in claim 1, 5, 6, 7, or 8 where the input impedance of the buffer amplifier is substantially equal to the input resistance of said buffer amplifier.

14. A monolithic microwave buffer amplifier as in claim 1, 5, 6, 7, or 8 where the first stage comprises an emitter follower circuit.

15. A monolithic microwave buffer amplifier as in claim 14 where the second stage comprises a common emitter circuit.

16. A monolithic microwave buffer amplifier as in claim 14 where the second stage comprises a capacitive element.

17. A monolithic microwave buffer amplifier as in claim 1, 5, 6, 7, or 8 where the second stage comprises a common emitter circuit.

18. A monolithic microwave buffer amplifier as in claim 1, 5, 6, 7, or 8 where the second stage comprises a capacitive element.

19. A monolithic microwave buffer amplifier as in claim 1, 5, 6, 7 or 8 where the first and second stages each include a transistor.

* * * * *